(12) United States Patent
Chen (10) Patent No.: US 11,789,066 B2
(45) Date of Patent: Oct. 17, 2023

(54) METHOD FOR MANUFACTURING ELECTRONIC DEVICE HAVING A SEED LAYER ON A SUBSTRATE

(71) Applicant: Innolux Corporation, Miao-Li County (TW)

(72) Inventor: Yeong-E Chen, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 8 days.

(21) Appl. No.: 17/834,869

(22) Filed: Jun. 7, 2022

(65) Prior Publication Data
US 2022/0299565 A1    Sep. 22, 2022

Related U.S. Application Data

(63) Continuation of application No. 16/861,230, filed on Apr. 29, 2020, now Pat. No. 11,378,618.

(51) Int. Cl.
*G01R 31/28* (2006.01)
*H01L 21/768* (2006.01)
*H01L 23/00* (2006.01)

(52) U.S. Cl.
CPC ..... *G01R 31/2884* (2013.01); *G01R 31/2831* (2013.01); *H01L 21/76871* (2013.01); *H01L 24/06* (2013.01)

(58) Field of Classification Search
CPC ............ G01R 31/2831; G01R 31/2884; H01L 21/67242; H01L 21/76871; H01L 24/06; H01L 23/34; H01L 2021/67242
USPC ................................................. 438/11, 14, 18
See application file for complete search history.

(56) References Cited

U.S. PATENT DOCUMENTS

2013/0026466 A1 *    1/2013    Pagani ..................... H01L 24/05
257/E23.179

* cited by examiner

*Primary Examiner* — Hoai V Pham
(74) *Attorney, Agent, or Firm* — JCIPRNET (57) ABSTRACT

A method for manufacturing an electronic device includes the following steps. A substrate including a first region and a second region is provided. A seed layer is formed on the substrate. A circuit structure layer is formed on the seed layer, and the circuit structure layer has a plurality of first circuit structures disposed on the first region and a plurality of second circuit structures disposed on the second region. The first circuit structures and the second circuit structures are electrically connected through the seed layer. A circuit test process is performed and includes applying a predetermined voltage to the second circuit structures to test the first circuit structures to determine whether the first circuit structures are normal or not.

9 Claims, 9 Drawing Sheets

METHOD FOR MANUFACTURING ELECTRONIC DEVICE HAVING A SEED LAYER ON A SUBSTRATE

CROSS-REFERENCE TO RELATED APPLICATION

This application is a continuation of an application Ser. No. 16/861,230, filed on Apr. 29, 2020, now allowed. The entirety of the above-mentioned patent application is hereby incorporated by reference herein and made a part of specification.

BACKGROUND

Technical Field

The disclosure relates to a method for manufacturing an electronic device, and more particularly to a method for manufacturing an electronic device, which can make the manufactured electronic device have better reliability.

Description of Related Art

Electronic products have become indispensable in the modern society. With the rapid development of electronic products, some techniques (such as test technique, process technique) used in the electronic products are constantly improving. How to improve the yield of electronic devices or reduce costs has become a continuous improvement project.

SUMMARY

The disclosure is directed to a method for manufacturing an electronic device, which can make the manufactured electronic device have better reliability.

According to an embodiment of the disclosure, a method for manufacturing an electronic device includes the following steps. A substrate is provided, and the substrate includes a first region and a second region. A seed layer is formed on the substrate. A circuit structure layer is formed on the seed layer, and the circuit structure layer has a plurality of first circuit structures disposed in the first region and a plurality of second circuit structures disposed in the second region. The plurality of first circuit structures and the plurality of second circuit structures are electrically connected through the seed layer. A circuit test process is performed, and the circuit test process includes applying a predetermined voltage to the plurality of second circuit structures to test the plurality of first circuit structures to determine whether the plurality of first circuit structures are normal or not.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of the specification. The drawings illustrate exemplary embodiments of the disclosure and, together with the description, serve to explain the principles of the disclosure.

DESCRIPTION OF THE EMBODIMENTS

The disclosure can be understood by referring to the following detailed description in conjunction with the accompanying drawings. It should be noted that in order to make the reader easy to understand and for the sake of simplicity of the drawings, the multiple drawings in the disclosure only depict a part of the electronic device, and certain elements in the drawings are not drawn according to actual scale. In addition, the number and size of each element in the figure are only for illustration, and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It should be understood that when an element or film is referred to as being "on" or "connected to" another element or layer, it can be directly on or directly connected to the other element or layer, or exist an intervening element or layer between the two (indirect case). In contrast, when an element is referred to as being "directly on" or "directly connected to" another element or layer, there are no intervening elements or layers present.

The terms "about", "substantially", "equal", or "same" generally mean within 20% of a given value or range, or mean within 10%, 5%, 3%, 2%, 1%, or 0.5% of a given value or range.

In addition, the phrase "in a range from a first value to a second value" indicates the range includes the first value, the second value, and other values in between.

The electronic device of the disclosure may include a display device, an antenna device (such as liquid crystal antenna), a sensing device, a lighting device, a touch device, a curved device, a free shape device, a bendable device, flexible device, tiled device or a combination thereof, but is not limited thereto. The electronic device may include light-emitting diode, liquid crystal, fluorescence, phosphor, other suitable materials or a combination thereof, but is not limited thereto. The light emitting diode may include organic light emitting diode (OLED), inorganic light emitting diode (LED), mini LED, micro LED or quantum dot light emitting diode (quantum dot, QD, for example, QLED, QDLED), other suitable materials or any combination of the above, but is not limited thereto.

Although the terms first, second, third etc. can be used to describe various constituent elements, the constituent elements are not limited by the term. The term is only used to distinguish a single constituent element from other constituent elements in the specification. The same terms may not be used in the claims, but may be replaced by first, second, third, etc. in the order of element declarations in the claims. Therefore, in the following specification, a first constituent element may be a second constituent element in the claims.

In some embodiments of the present disclosure, unless specifically defined otherwise, the terms related to joining and connection, such as "connected" and "interconnected", may refer to two structures being in direct contact, or may refer to two structures not being in direct contact and other structures are provided between the two structures. Moreover, the terms about joining and connecting may include a case where two structures are movable or two structures are fixed. In addition, the term "coupled" includes any direct and indirect electrical connection means.

It will be understood that when an element or layer is referred to as being "(electrically) connected to" another element or layer, it can be directly (electrically) connected to the other element or layer, or intervening elements or layers may be presented. In contrast, when an element is referred to as being "directly (electrically) connected to" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being "disposed between" A element and B element, it may be directly disposed between A element and B element, or may be indirectly disposed between A element and B element through other component.

It should be noted that the following embodiments can be replaced, recombined, and mixed to complete other embodiments without departing from the spirit of the present disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 1:
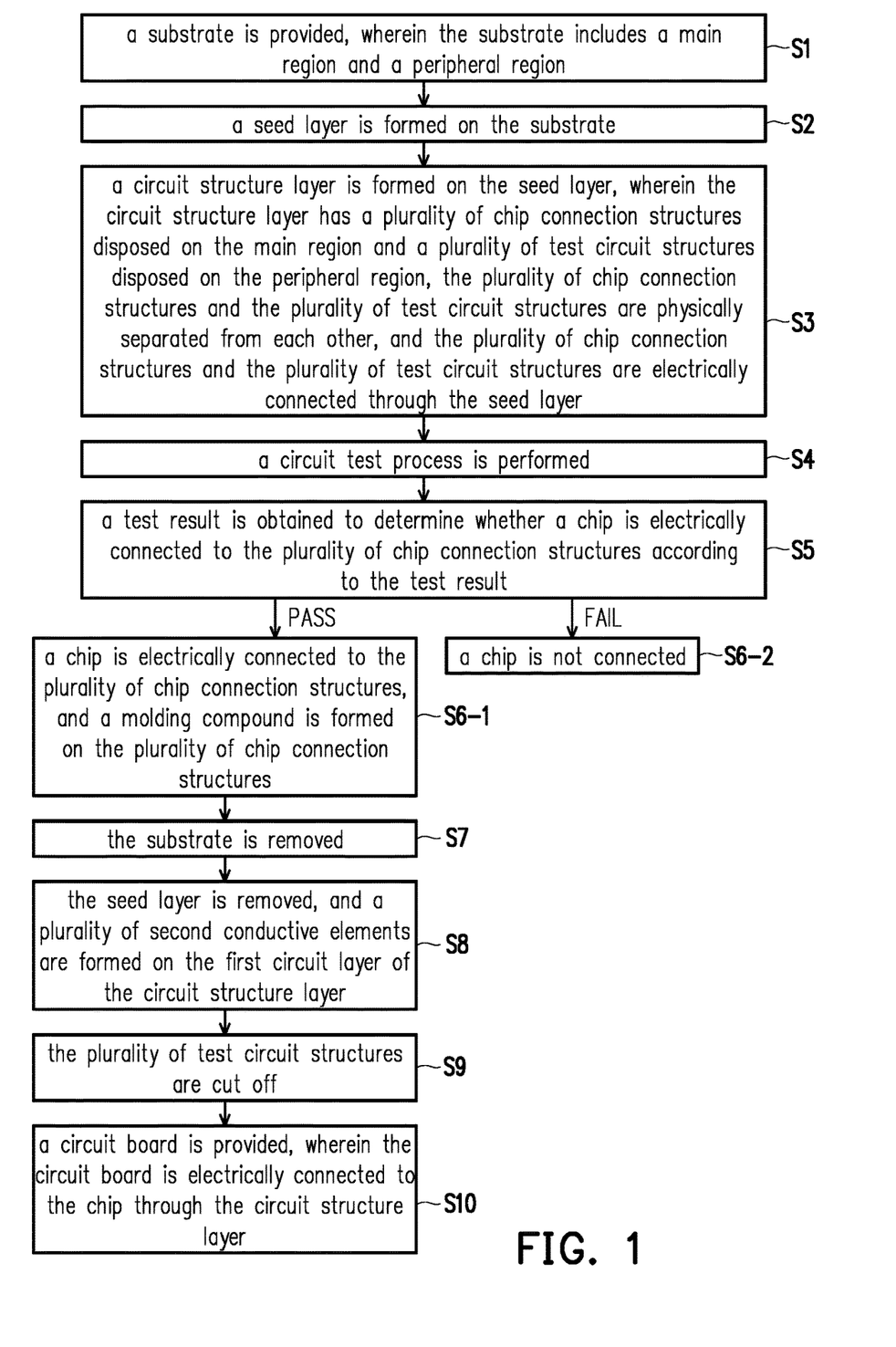
FIG. 1 is a flowchart of a method for manufacturing an electronic device according to an embodiment of the disclosure.

FIG. 1 is a flowchart of a method for manufacturing an electronic device according to an embodiment of the disclosure. FIG. 2A to FIG. 2G are schematic views of a method for manufacturing an electronic device according to an embodiment of the disclosure. FIG. 2B is a schematic cross-sectional view along line A-A' of FIG. 2A. For the sake of clarity and easy description of the drawings, FIG. 2A omits illustration of several elements.

Figure 2A:
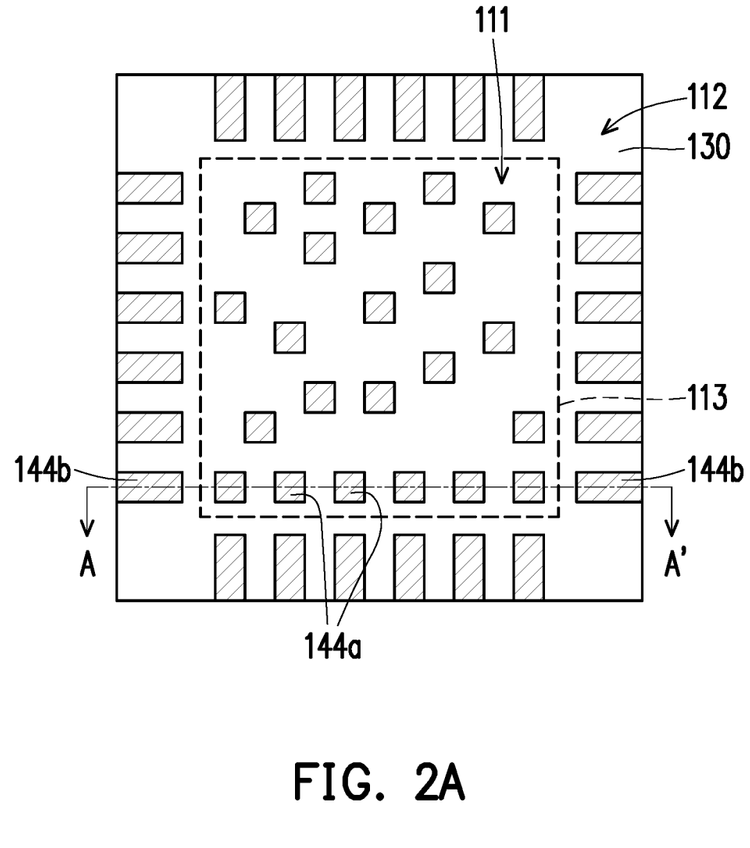
FIG. 2A to FIG. 2G are schematic views of a method for manufacturing an electronic device according to an embodiment of the disclosure.
Figure 2B:
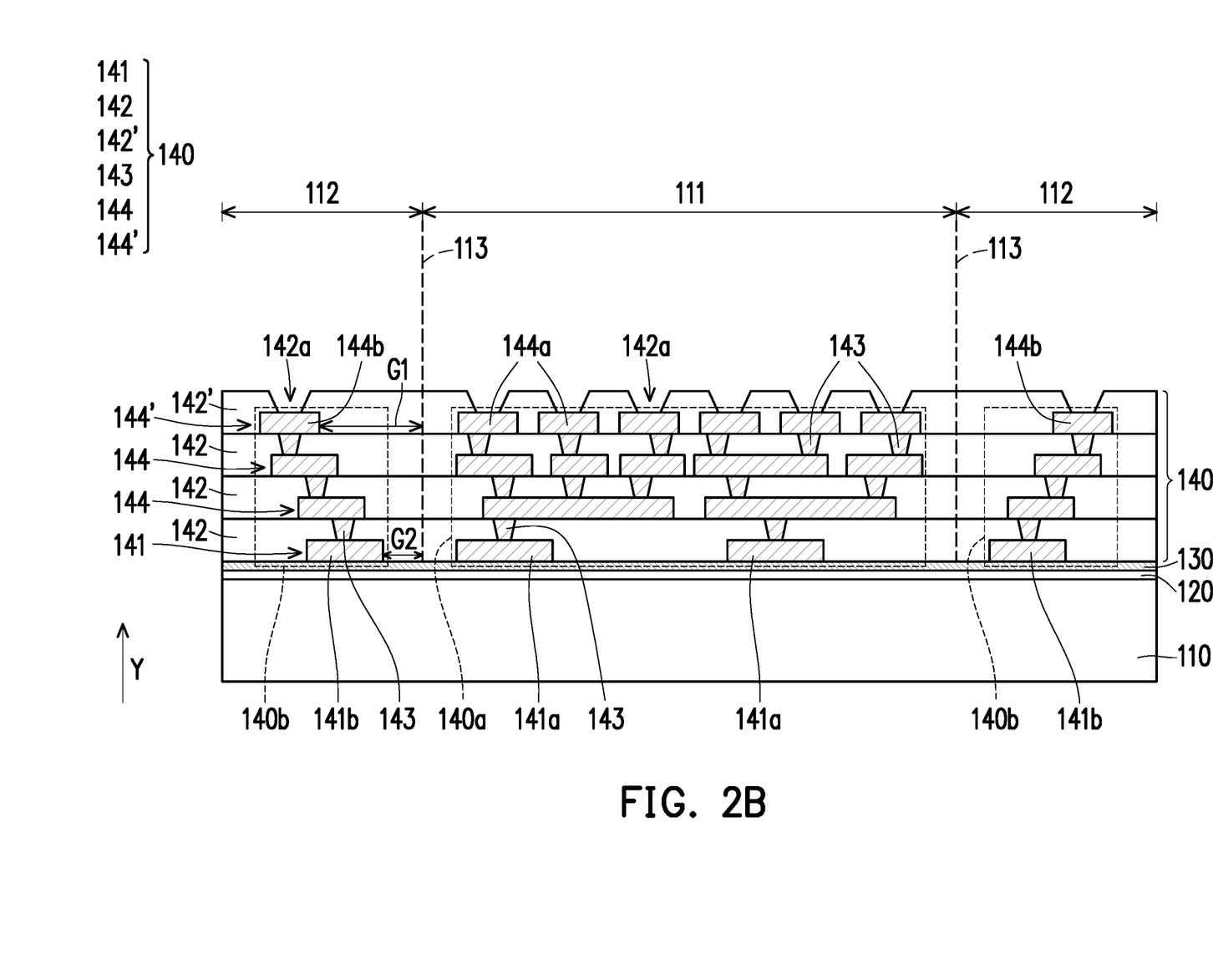

Referring to FIG. 1, FIG. 2A, and FIG. 2B simultaneously, in the method for manufacturing an electronic device in the present embodiment, steps S1, S2, and S3 are performed first. In the step S1, a substrate 110 is provided. The substrate 110 includes a main region 111, a peripheral region 112 and a cutting line 113. The cutting line 113 is disposed at a boundary between the main region 111 and the peripheral region 112. The peripheral region 112 is cut off in a subsequent cutting step, but the main region 111 is retained in the subsequent cutting step. In the present embodiment, the substrate 110 may be a rigid substrate. For example, a material of the substrate 110 may include glass, quartz, sapphire, ceramic, other suitable substrate materials, or a combination thereof, but is not limited thereto.

In the present embodiment, a release layer 120 is formed on the substrate 110, but is not limited thereto. The release layer 120 may include a polymer-based material, but is not limited thereto. The release layer 120 may be removed in a subsequent step. In some embodiments, the release layer 120 may include an epoxy-based heat release material that may lose its adhesive properties when the release layer 120 is heated, such as a light-to-heat-conversion (LTHC) release coating, but is not limited thereto. In other embodiments, the release layer 120 may include ultra-violet (UV) adhesive that may lose its adhesive properties when the release layer 120 is exposed by UV light, but is not limited thereto.

In the step S2, a seed layer 130 is formed on or disposed on the substrate 110 and/or the release layer 120. The seed layer 130 is disposed on the main region 111 of the substrate 110 and the peripheral region 112 of the substrate 110. In some embodiments (not shown), the seed layer 130 covers at least part of the substrate 110 and at least part of the release layer 120. In some embodiments, the seed layer 130 may be a single layer or a composite layer including a plurality of sub-layers made of different materials. The materials of the seed layer 130 may include titanium, copper, other suitable materials or a combination thereof. In other words, in the present embodiment, the seed layer 130 may include a titanium layer and a copper layer located on the titanium layer, but is not limited thereto.

In the step S3, a circuit structure layer 140 is formed on or disposed on the seed layer 130. In the present embodiment, the circuit structure layer 140 may be a re-distribution layer (RDL), and the circuit structure layer 140 may be manufactured in the following steps.

Specifically, a patterned photoresist (not shown) is formed on the seed layer 130, firstly. The patterned photoresist has a plurality of openings, and the openings expose a part of the seed layer 130. A plating covering process (such as electroplating) is adopted to form a first circuit layer 141 in the openings of the patterned photoresist and on the exposed seed layer 130. The first circuit layer 141 may include copper, titanium, tungsten, aluminum, other suitable materials, or a combination thereof, but is not limited thereto. Then, the patterned photoresist is removed and another part of the seed layer 130 is exposed. In the present embodiment, the exposed seed layer 130 is not removed. In addition, the first circuit layer 141 and the release layer 120 are respectively located at two opposite sides of the seed layer 130. The first circuit layer 141 includes a plurality of lower conductive pads 141a, 141b, wherein the lower conductive pads 141a are disposed in the main region 111, and the lower conductive pads 141b are disposed in the peripheral region 112. The lower conductive pads 141a and the lower conductive pads 141b are physically separated from each other, and the lower conductive pads 141a and the lower conductive pads 141b are electrically connected through the seed layer 130.

Next, a dielectric layer 142 is formed on the first circuit layer 141, the dielectric layer 142 may cover the first circuit layer 141 and the exposed seed layer 130. After forming a plurality of vias (not shown) in the dielectric layer 142 and exposing a part of the first circuit layer 141, a conductive material is filled in or located in the plurality of vias to form a plurality of conductive vias 143. The plurality of conductive vias 143 are electrically connected to the first circuit layer 141. In some embodiments, the conductive material may include copper, titanium, tungsten or aluminum, but is not limited thereto. The material of the conductive material and the material of the first circuit layer 141 may be the same or different. A second circuit layer 144 is formed on the dielectric layer 142, and the second circuit layer 144 is electrically connected to the first circuit layer 141 through the plurality of conductive vias 143.

Finally, repeating the above steps to sequentially form other dielectric layers 142, conductive vias 143 and/or other second circuit layers 144. The uppermost second circuit layer 144' includes a plurality of upper conductive pads 144a, and a plurality of upper conductive pads 144b, wherein the upper conductive pads 144a are disposed in the main region 111, and the upper conductive pads 144b are disposed in the peripheral region 112. The upper conductive pads 144a and the upper conductive pads 144b are physically separated from each other, and the upper conductive pads 144a and the upper conductive pads 144b are electrically connected through the seed layer 130. The uppermost dielectric layer 142' may cover the uppermost second circuit layer 144', and the openings 142a of the uppermost dielectric layer 142' respectively expose part of the upper conductive pads 144a and part of the upper conductive pads 144b. The manufacturing of the circuit structure layer 140 is completed so far. In some embodiments, the uppermost second circuit layer 144' may be patterned, and the uppermost dielectric layer 142' may selectivity remove.

In short, the circuit structure layer 140 of the present embodiment includes the first circuit layer 141, the at least one second circuit layer 144, the at least one dielectric layer 142 and the plurality of conductive vias 143, wherein the first circuit layer 141 is disposed on the seed layer 130, the at least one dielectric layer 142 and the at least one second circuit layer 144 are sequentially stacked on the first circuit layer 141, and the plurality of conductive vias 143 penetrate the at least one dielectric layer 142 to electrically connect the at least one second circuit layer 144 and the first circuit layer 141.

Referring to FIG. 2B again, in the present embodiment, the circuit structure layer 140 has a plurality of chip connection structures 140a disposed on the main region 111 and a plurality of test circuit structures 140b disposed on the peripheral region 112. The plurality of test circuit structures 140b includes a part of the first circuit layer 141, a part of the second circuit layer 144, a part of the dielectric layer 142 and a part of the conductive vias 143. The plurality of chip connection structures 140a includes another part of the first circuit layer 141, another part of the second circuit layer 144, another part of the dielectric layer 142 and another part of the conductive vias 143. In the present embodiment, the plurality of chip connection structures 140a and the plurality of test circuit structures 140b are physically separated from each other, and the plurality of chip connection structures 140a and the plurality of test circuit structures 140b are electrically connected through the seed layer 130.

In the present embodiment, at least one of the plurality of test circuit structures 140b include an upper conductive pad 144b and a lower conductive pad 141b, but is not limited thereto). In a normal direction Y of the substrate 110, there is a gap G1 between the upper conductive pad 144b of the test circuit structure 140b and the cutting line 113, and there is a gap G2 between the lower conductive pad 141b of the test circuit structure 140b and the cutting line 113.

Figure 2C:
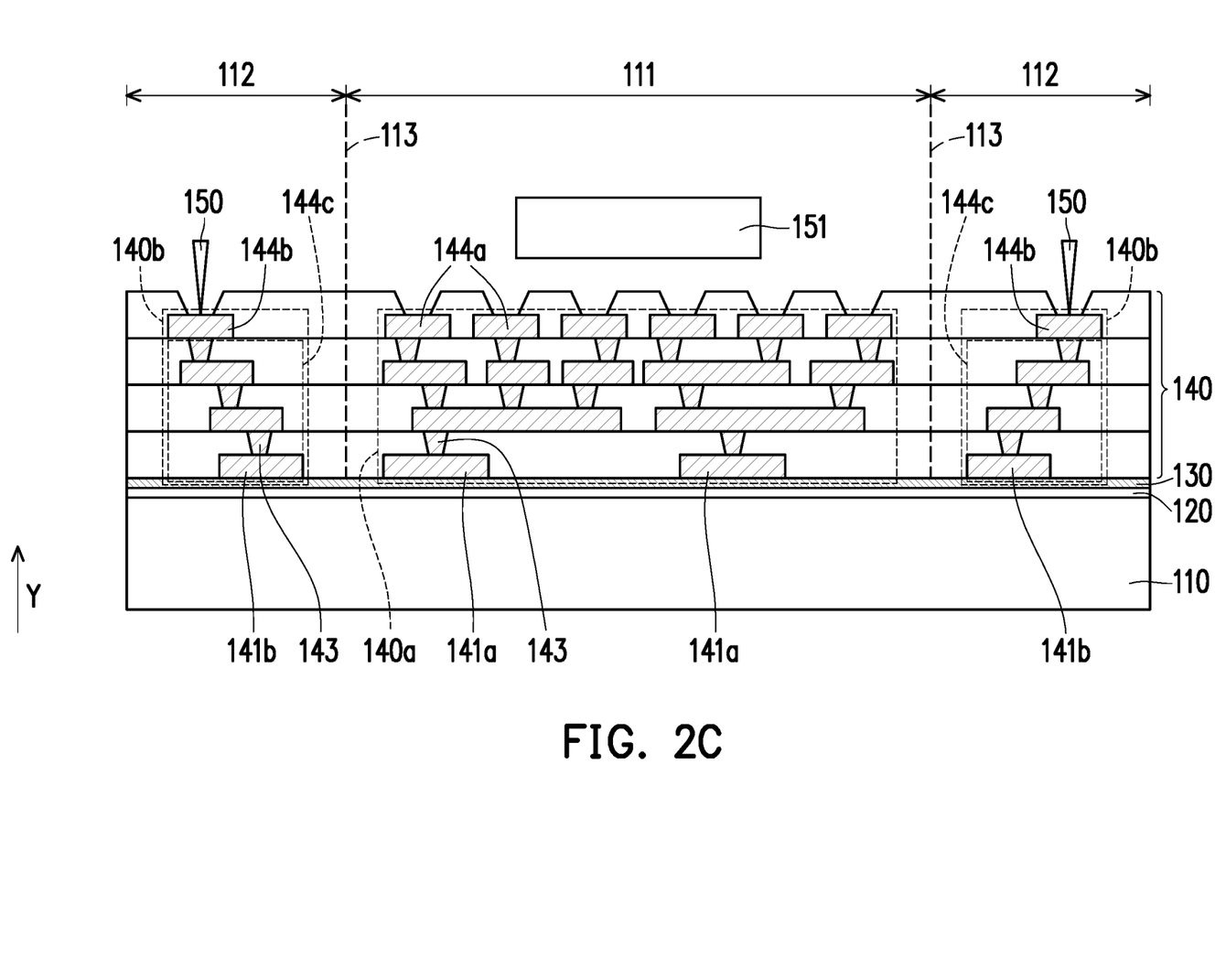

Referring to FIG. 1 and FIG. 2C, in step S4, a circuit test process is performed. The circuit test process includes applying a predetermined voltage to the plurality of test circuit structures 140b to test the plurality of chip connection structures 140a. In some embodiment, the predetermined voltage is applied to the plurality of test circuit structures 140b by contacting.

Specifically, in the present embodiment, at least one of the plurality of test circuit structure 140b includes an upper conductive pad 144b and a conductive structure 144c (including the other second circuit layers 144 disposed in the peripheral region 112 and lower conductive pads 141b, but is not limited thereto), and the upper conductive pad 144b is directly connected to the conductive structure 144c.

Next, in the circuit test process, the predetermined voltage is applied to the plurality of test circuit structures 140b by contacting to the upper conductive pads 144b with probes 150. Then, the predetermined voltage is transmitted to the seed layer 130 to generate a voltage distribution. Therefore, when the predetermined voltage is transmitted to the upper conductive pads 144a of the chip connection structures 140a through the seed layer 130. In some embodiments, the chip connection structures 140a, a sensor 151 may be used to detect the voltage of the upper conductive pads 144a of the chip connection structures 140a in non-contact manner (such as capacitive coupling, but is not limited thereto). In the present embodiment, the sensor 151 using a non-contact manner to detect the voltage of the upper conductive pads 144a of the chip connection structure 140a, the upper conductive pads 144a may be prevented from being damaged due to the sensor 151 contact, and the chip connection structure 140a may have better reliability.

In addition, the probes 150 can transmit voltage to the upper conductive pads 144a of the chip connection structures 140a through the test circuit structures 140b and/or the seed layer 130, the probes 150 do not need to contact the upper conductive pads 144a of the chip connection structures 140a during performing a circuit test process on the chip connection structures 140a. Thereby, the upper conductive pad 144a of the chip connection structures 140a may be prevented from being damaged due to the probes 150 contact, and the chip connection structure 140a may have better reliability.

Figure 2D:
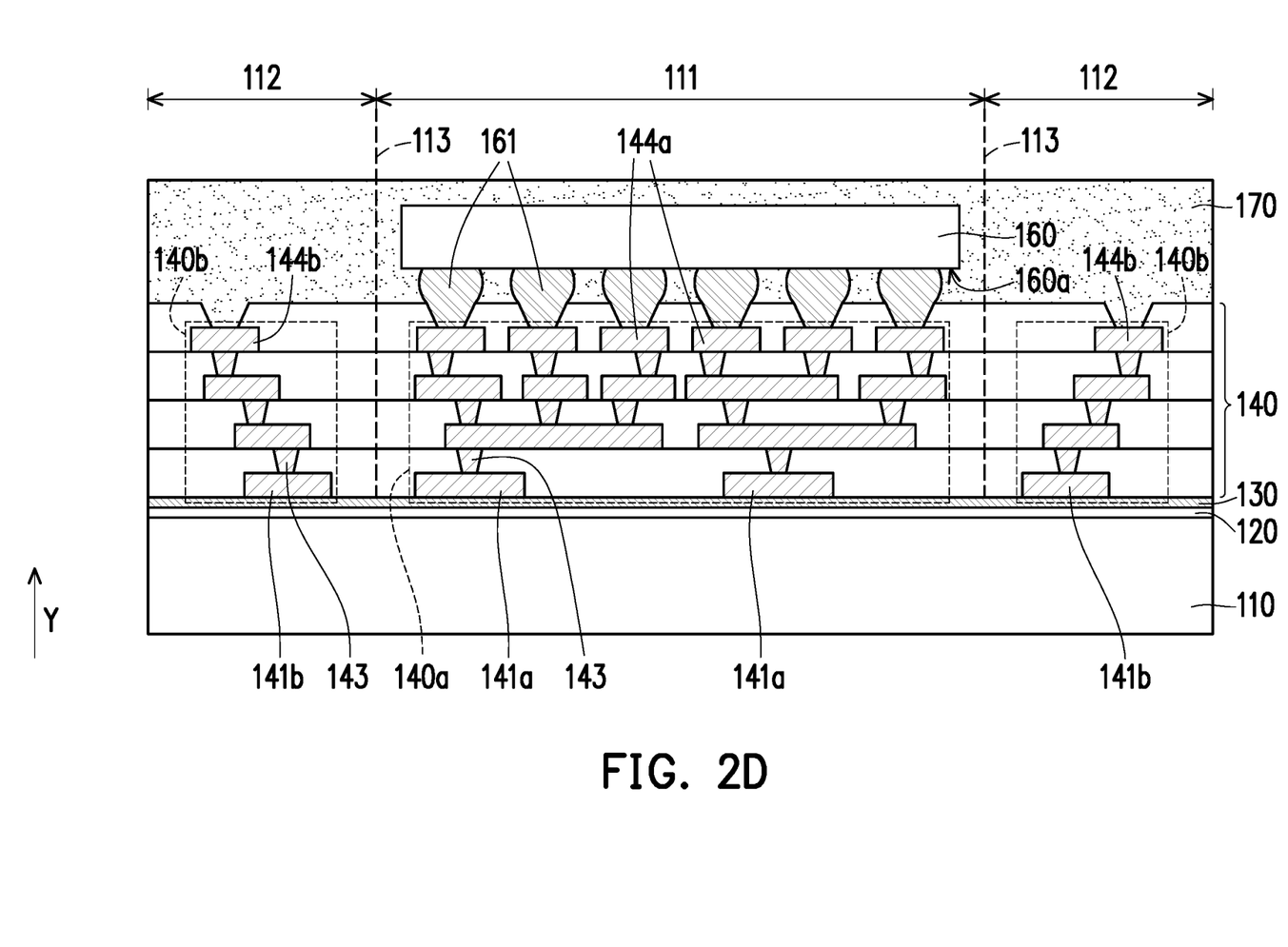

Referring to FIG. 1 and FIG. 2D, steps S5, S6-1 and S6-2 are performed. In the step 5, a test result is obtained to determine whether a chip 160 is electrically connected to the plurality of chip connection structures 140a according to the test result. Specifically, if the test result passes after comparing the test result with a normal sample, it means that the chip connection structure 140a may be suitable for connecting to the chip 160, as shown in step 6-1. Conversely, if the test result fails after comparing the test result with the normal sample, it means that the chip connection structures 140a may have open circuit or short circuit issues, and may not be suitable for connecting to the chip 160, as shown in step 6-2.

In addition, in the method for manufacturing the electronic device of the present embodiment, the chip 160 is disposed on the chip connection structures 140a after the circuit structure layer 140 is manufactured and the circuit test process is performed. Therefore, compared with the conventional electronic device (the chip is disposed before the circuit structure layer is manufactured), the method for manufacturing the electronic device of the present embodiment may reduce from waste the chip due to the poor manufacturing of the circuit structure layer.

Next, in the step 6-1, the chip 160 is electrically connected to the plurality of chip connection structures 140a, and a molding compound 170 is form on the plurality of chip connection structures 140a. Specifically, as shown in FIG. 2D, before the chip 160 is electrically connected to the plurality of chip connection structures 140a, a plurality of first conductive elements 161 are formed on an active surface 160a of the chip 160. The chip 160 is electrically connected to the plurality of chip connection structures 140a through the plurality of first conductive elements 161. In the present embodiment, the plurality of first conductive elements 161 may include solder balls, but is not limited thereto. The molding compound 170 covers the chip 160 and the plurality of first conductive elements 161. In some embodiments, the molding compound 170 is disposed on or covers the at least part of the circuit structure layer 140.

Figure 2E:
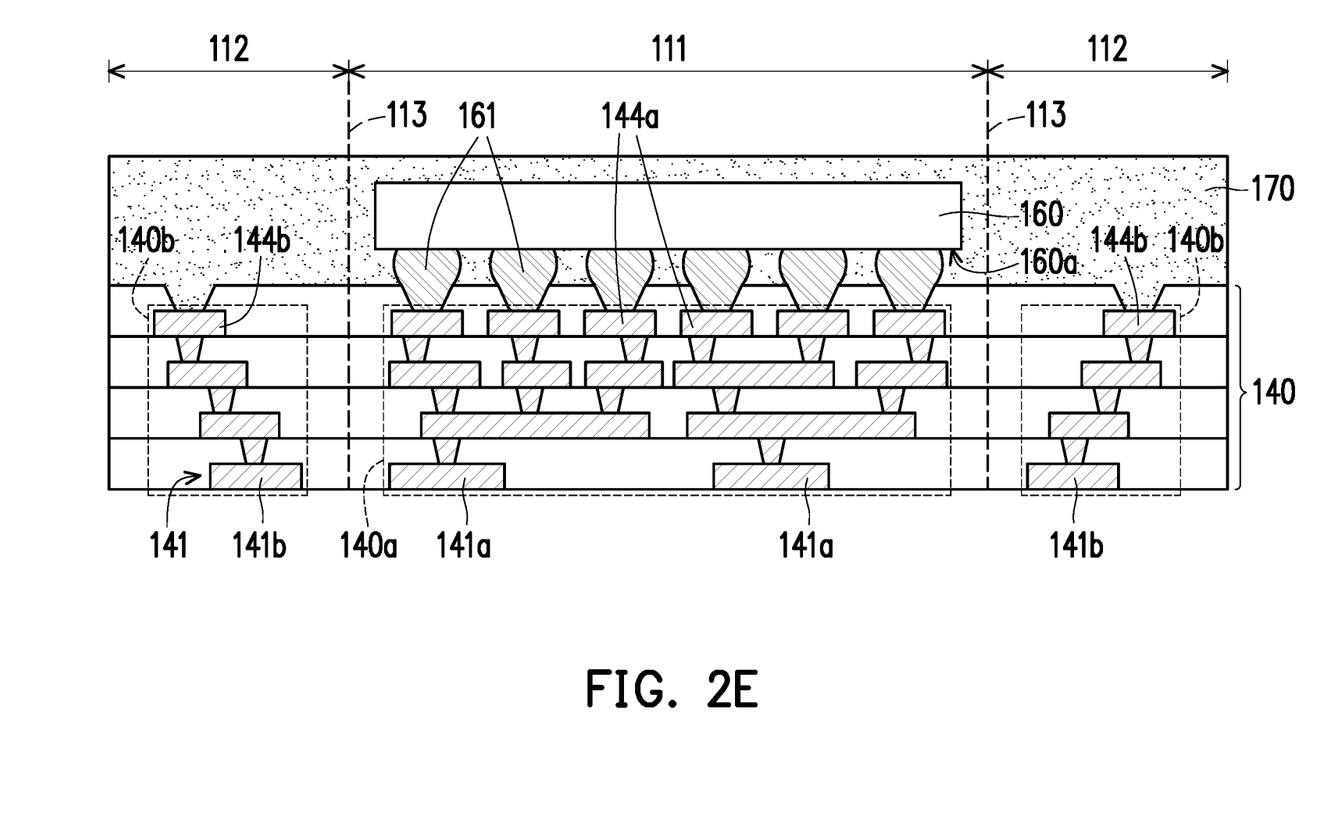

Referring to FIG. 1 and FIGS. 2D-2E, steps S7 and S8 are performed. In the step S7, after performing the circuit test process, the substrate 110 and the release layer 120 are removed by, for example, laser lift-off (LLO), but is not limited thereto. During laser lift-off, the seed layer 130 may be used as a protective layer to reduce the plurality of chip connection structures 140a from being damaged by the laser.

Next, in the step S8, the seed layer 130 is removed after removing the substrate 110 and the release layer 120. After removing the seed layer 130, the lower conductive pads 141a and the lower conductive pads 141b of the first circuit layer 141 are exposed.

Figure 2F:
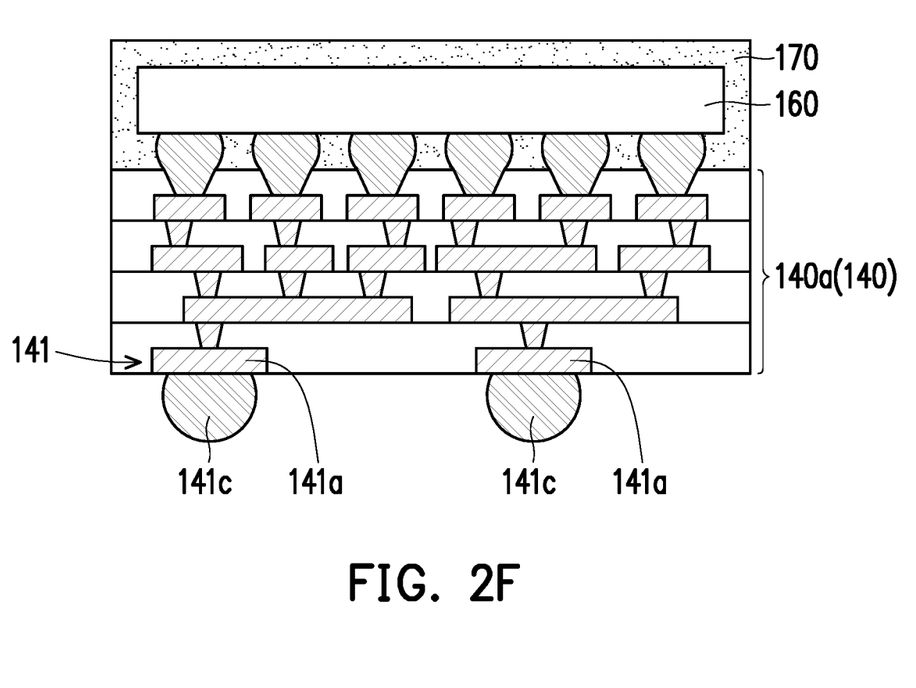

Referring to FIG. 1 and FIGS. 2E-2F, step S9 is performed. In the step S9, after removing the seed layer 130, a plurality of second conductive elements 141c are formed on the lower conductive pads 141a of the first circuit layer 141 of the circuit structure layer 140, and the plurality of test circuit structures 140b are cut off according to the cutting line 113 of the substrate 110. In the present embodiment, the plurality of second conductive elements 141c may include solder balls, but is not limited thereto.

Figure 2G:
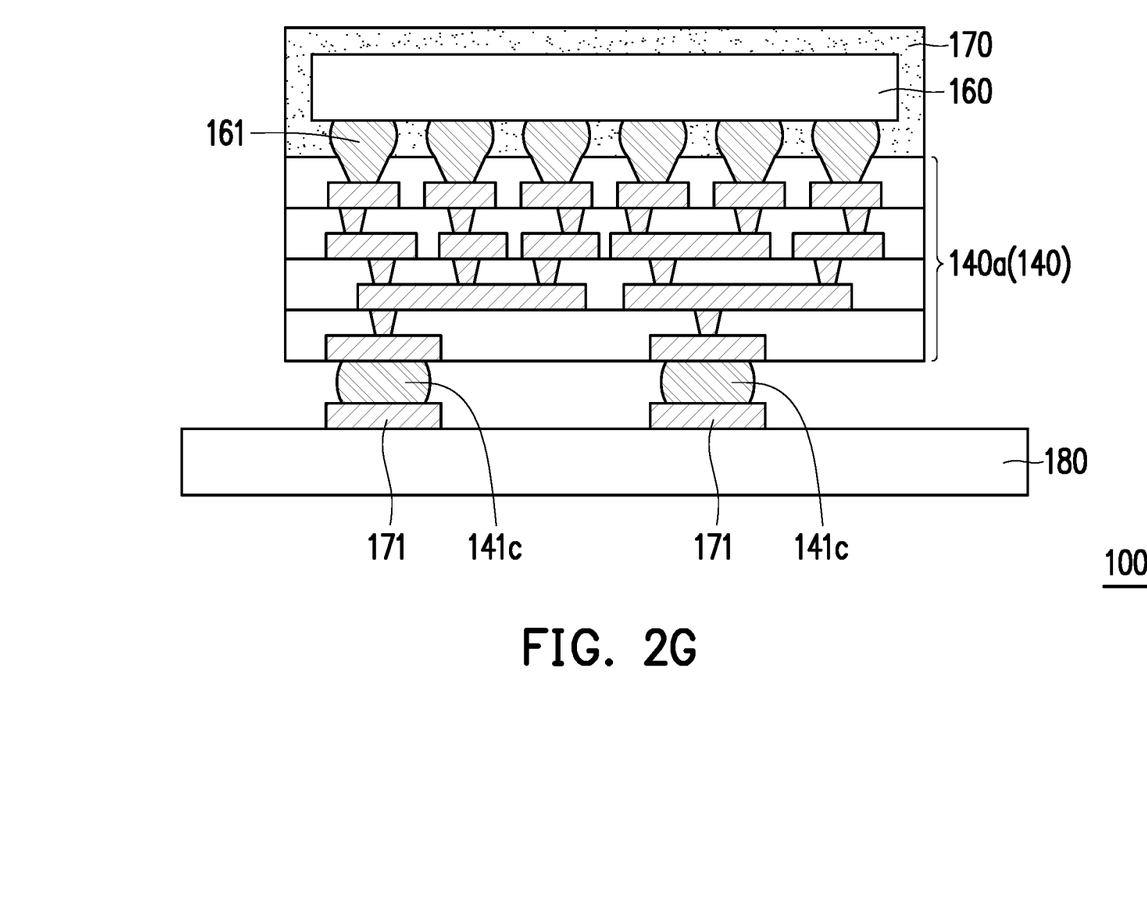

Referring to FIG. 1 and FIG. 2G, step S10 is performed. In the step S10, after cutting off the plurality of test circuit structures 140b, a circuit board 180 is provided. Specifically, after cutting off the plurality of test circuit structures 140b, the plurality of chip connection structures 140a of the circuit structure layer 140 are disposed on and electrically connected to the conductive pads 171 of the circuit board 180 through the plurality of second conductive elements 141c. Therefore, the circuit board 180 may be electrically connected to the chip 160 through the circuit structure layer 140. In the present embodiment, the circuit board 180 may include a flexible circuit board, a rigid circuit board or an array substrate, but is not limited thereto. The manufacturing of the electronic device 100 is completed so far.

Other embodiments will be listed below for illustration. It must be noted that, the following embodiments use the component numbers and parts of the foregoing embodiments, in which the same reference numerals are used to indicate the same or similar components, and the description of the same technical content is omitted. For the description of the omitted parts, reference may be made to the foregoing embodiments, and the following embodiments are not repeated.

Figure 3:
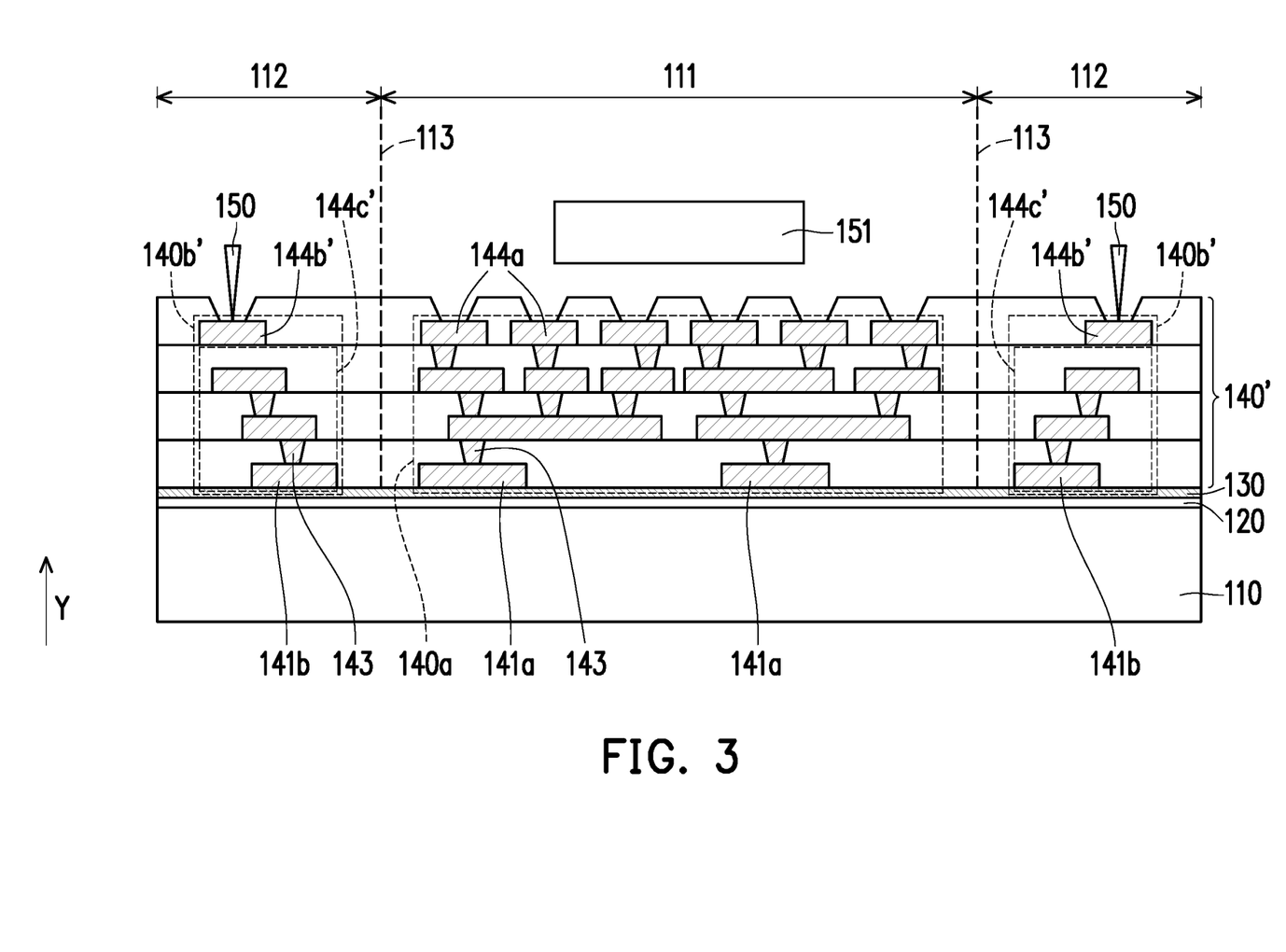
FIG. 3 is a schematic cross-sectional view of a method for manufacturing an electronic device according to another embodiment of the disclosure.

FIG. 3 is a schematic cross-sectional view of a method for manufacturing an electronic device according to another embodiment of the disclosure. Please referring to FIG. 2C and FIG. 3 at the same time, a circuit structure layer 140' in the present embodiment is substantially similar to the circuit structure layer 140 in FIG. 2C. The circuit structure layer 140' of the present embodiment is different from the circuit structure layer 140 mainly in that: in the circuit structure layer 140' of the present embodiment, at least one of the plurality of test circuit structures 140b' comprises an upper conductive pad 144b' and a conductive structure 144c', the upper conductive pad 144b' of the plurality of test circuit structures 140b' is not directly connected to the conductive structure 144c' of the plurality of test circuit structures 140b'. Therefore, in the present embodiment, the predetermined voltage is applied to the plurality of test circuit structures 140b' in non-contact manner (such as capacitive coupling, but is not limited thereto) by probes.

In summary, in the method for manufacturing the electronic device according to the embodiment of the present disclosure, since the probes can transmit voltage to the conductive pads of the chip connection structures through the test circuit structures and the seed layer, the probes do not need to contact the conductive pads of the chip connection structures during performing a circuit test process on the chip connection structures. Thereby, the conductive pad of the chip connection structures may be prevented from being damaged due to the probes contact, and the chip connection structure may have better reliability. In addition, during laser lift-off, the seed layer may be used as a protective layer to prevent the plurality of chip connection structures from being damaged by the laser.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing an electronic device, comprising:
   providing a substrate, wherein the substrate comprises a first region and a second region;
   forming a seed layer on the substrate;
   forming a circuit structure layer on the seed layer, wherein the circuit structure layer has a plurality of first circuit structures disposed on the first region and a plurality of second circuit structures disposed on the second region, the plurality of first circuit structures and the plurality of second circuit structures are electrically connected through the seed layer; and
   performing a circuit test process, wherein the circuit test process comprising applying a predetermined voltage to the plurality of second circuit structures to test the plurality of first circuit structures to determine whether the plurality of first circuit structures are normal or not.

2. The method as claimed in claim 1, wherein the plurality of first circuit structures and the plurality of second circuit structures are physically separated from each other.

3. The method as claimed in claim 1, further comprising:
   providing a chip on the plurality of first circuit structures when the plurality of first circuit structures are normal.

4. The method as claimed in claim 3, further comprising:
   forming a plurality of first conductive elements, wherein the chip is electrically connected to the plurality of first circuit structures through the plurality of first conductive elements.

5. The method as claimed in claim 4, further comprising:
   forming a molding compound on the plurality of first circuit structures, wherein the molding compound covers the chip.

6. The method as claimed in claim 5, further comprising:
   removing the substrate after performing the circuit test process; and
   removing the seed layer after removing the substrate.

7. The method as claimed in claim 6, further comprising:
   cutting off the plurality of second circuit structures according to a cutting line of the substrate after removing the seed layer.

8. The method as claimed in claim 7, further comprising:
   forming a plurality of second conductive elements on the plurality of first circuit structures after cutting off the plurality of second circuit structures.

9. The method as claimed in claim 8, further comprising:
providing a circuit board, wherein the circuit board is electrically connected to the chip through plurality of second conductive elements and the circuit structure layer.

* * * * *